(12) United States Patent
Burke et al.

(10) Patent No.: US 8,232,809 B2
(45) Date of Patent: Jul. 31, 2012

(54) DETERMINING CRITICAL CURRENT DENSITY FOR INTERCONNECT

(75) Inventors: Chad M. Burke, Barre, VT (US);
Cathryn J. Christiansen, Huntington, VT (US); Baozhen Li, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 12/620,955

(22) Filed: Nov. 18, 2009

(65) Prior Publication Data

US 2011/0115508 A1    May 19, 2011

(51) Int. Cl.
*G01R 31/02* (2006.01)
*G01R 31/26* (2006.01)
(52) U.S. Cl. .................. 324/537; 324/703; 324/762.01
(58) Field of Classification Search .................. None
See application file for complete search history.

(56) References Cited

U.S. PATENT DOCUMENTS

| | | | |
|---|---|---|---|
| 4,739,258 A * | 4/1988 | Schwarz | 324/537 |
| 5,514,974 A | 5/1996 | Bouldin | |
| 5,900,735 A | 5/1999 | Yamamoto | |
| 6,349,401 B2 | 2/2002 | Tamaki | |
| 6,714,037 B1 * | 3/2004 | Hau-Riege et al. | 324/750.03 |
| 6,725,433 B1 | 4/2004 | Hau-Riege et al. | |
| 7,301,239 B2 | 11/2007 | Wang et al. | |

* cited by examiner

*Primary Examiner* — Paresh Patel
(74) *Attorney, Agent, or Firm* — Hoffman Warnick LLC; Richard Kotulak

(57) ABSTRACT

Solutions for determining a critical current density of a line are disclosed. In one embodiment a method of determining a critical current density in a line includes: applying a temperature condition to each of a plurality of samples including the line; calculating a cross-sectional area of the line for each of the plurality samples using data about an electrical resistance of the line over each of the temperature conditions; measuring an electrical current reading through the line for each of the plurality of samples; determining a current density through the line for each of the plurality of samples by dividing each electrical current reading by each corresponding cross-sectional area; determining an electromigration (EM) failure time for each of the plurality of samples; and determining the critical current density of the line using the current density and the plurality of EM failure times.

20 Claims, 6 Drawing Sheets

DETERMINING CRITICAL CURRENT DENSITY FOR INTERCONNECT

BACKGROUND OF THE INVENTION

The subject matter disclosed herein relates to determining a critical current density for an interconnect (IC). Specifically, the subject matter disclosed herein relates to a structure and method for determining a critical current density for an interconnect using a single set of experimental data.

As structural dimensions of electronic interconnects have become ever-smaller, many design concerns have arisen, not least of which is controlling current densities carried through these ICs. Where current densities reach a critical level in electronic ICs, failures due to electromigration (EM) are much more likely. However, determining critical current densities in, for example, copper (Cu) interconnects, has been a data-intensive undertaking. Due to variations in Cu cross-sectional areas across lines, large amounts of data are needed to determine critical current densities in Cu interconnects. Multiple sets of data have to be gathered and analyzed to determine critical current densities that may cause EM failure. Generating and analyzing this data is both costly and time consuming.

BRIEF DESCRIPTION OF THE INVENTION

Solutions for determining a critical current density for an interconnect (IC) are disclosed. In one aspect, a method of determining a critical current density in a line is disclosed, the method comprising: applying a temperature condition to each of a plurality of samples including the line; calculating a cross-sectional area of the line for each of the plurality samples using data about an electrical resistance of the line over each of the temperature conditions; measuring an electrical current reading through the line for each of the plurality of samples; determining a current density through the line for each of the plurality of samples by dividing each electrical current reading by each corresponding cross-sectional area; determining an electromigration (EM) failure time for each of the plurality of samples; and determining the critical current density of the line using the current density and the plurality of EM failure times.

A first aspect of the invention provides a method of determining a critical current density in a line, the method comprising: applying a temperature condition to each of a plurality of samples including the line; calculating a cross-sectional area of the line for each of the plurality samples using data about an electrical resistance of the line over each of the temperature conditions; measuring an electrical current reading through the line for each of the plurality of samples; determining a current density through the line for each of the plurality of samples by dividing each electrical current reading by each corresponding cross-sectional area; determining an electromigration (EM) failure time for each of the plurality of samples; and determining the critical current density of the line using the current density and the plurality of EM failure times.

A second aspect of the invention provides a structure for measuring electromigration (EM) stress effect on an integrated circuit, the structure comprising: a first line configured to experience the EM stress, the first line connected to a second line and a third line through at least one via; a fourth line and a fifth line adjacent to and coplanar with the first line; and a sixth line configured to monitor an extrusion of the first line and a resistance of the fourth and the fifth lines at a plurality of temperature conditions, wherein each of the second line and the third line are on a different plane than the first line, and wherein the second line and the third line include are configured to: provide a stress current to the first line and measure a resistance of the first line while the first line is under the EM stress.

A third aspect of the invention provides a system for determining a critical current density in a line using a single set of samples, the system comprising: a resistor for measuring an electrical resistance of the line in each of a plurality of samples including the line, wherein each of the plurality of samples is measured at a temperature condition; a calculator for calculating a cross-sectional area of the line for each of the plurality of samples using the plurality of electrical resistances of the line over each of the temperature conditions; an ammeter for measuring an electrical current reading through the line for each of the plurality of samples; and a determinator for: determining a current density through the line for each of the plurality of samples by dividing each electrical current reading by each corresponding cross-sectional area; determining an electromigration (EM) failure time for each of the plurality of samples; and determining the critical current density of the line using the current density and the plurality of EM failure times.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide solutions for determining a critical current density for an interconnect. Aspects of the invention provide a method, a system, and a structure for determining a critical current density for an interconnect. While these embodiments may be described in conjunction with one another, each embodiment described herein may also be used in conjunction with other methods, systems and/or structures not explicitly described.

As used herein, the terms "line", "interconnect", and "device under test" (DUT) may be used interchangeably to refer to components in an integrated circuit. It is understood that as used herein, these components are capable of carrying an electrical current and may each benefit from the solutions described herein.

Determining the "critical product" (critical current density $(j_c) \times \text{length}(L)$) of a component (e.g., line) within a semiconductor device typically requires using multiple stress datasets at either different stress conditions or on metal lines with different lengths. As the component is reduced in size, the relative line cross sectional area variation within each wafer (in a plurality of wafers) becomes more pronounced. Further, the failure time distribution deviates more from the traditional lognormal distribution, especially for those lines with stress conditions closer to the critical product. This makes the traditional critical product determination difficult. To accurately determine the critical product, the line cross sectional area variation must be accurately measured.

Figure 1:
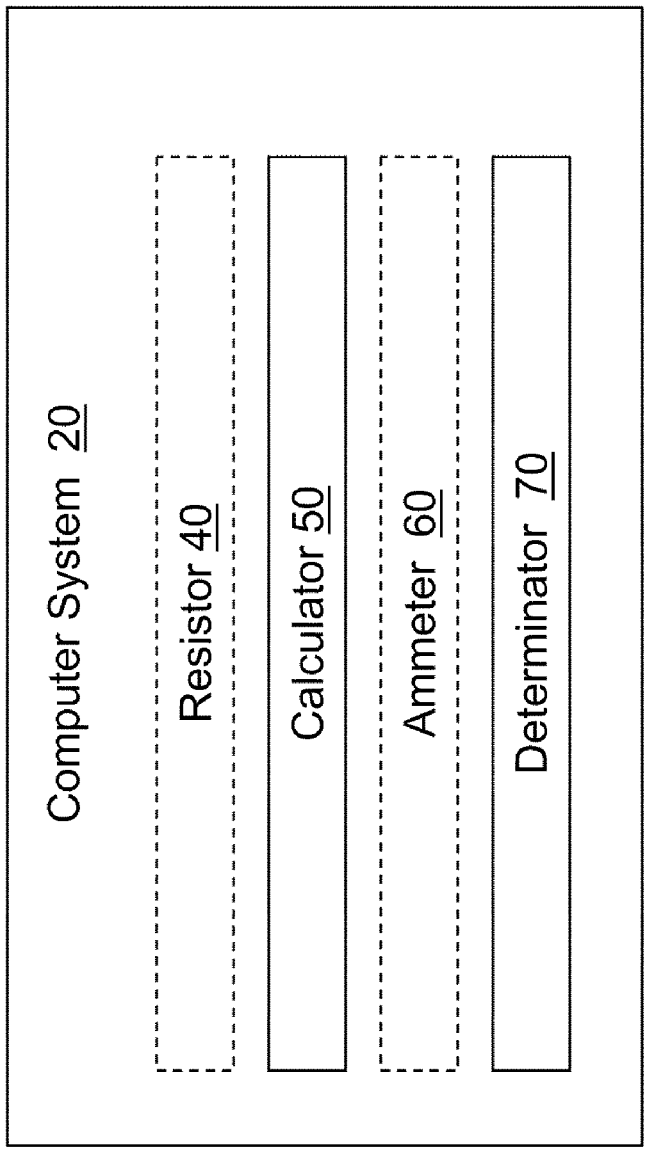
FIG. 1 shows a schematic diagram of an embodiment of a computer system according to one embodiment of the invention.
Figure 2:
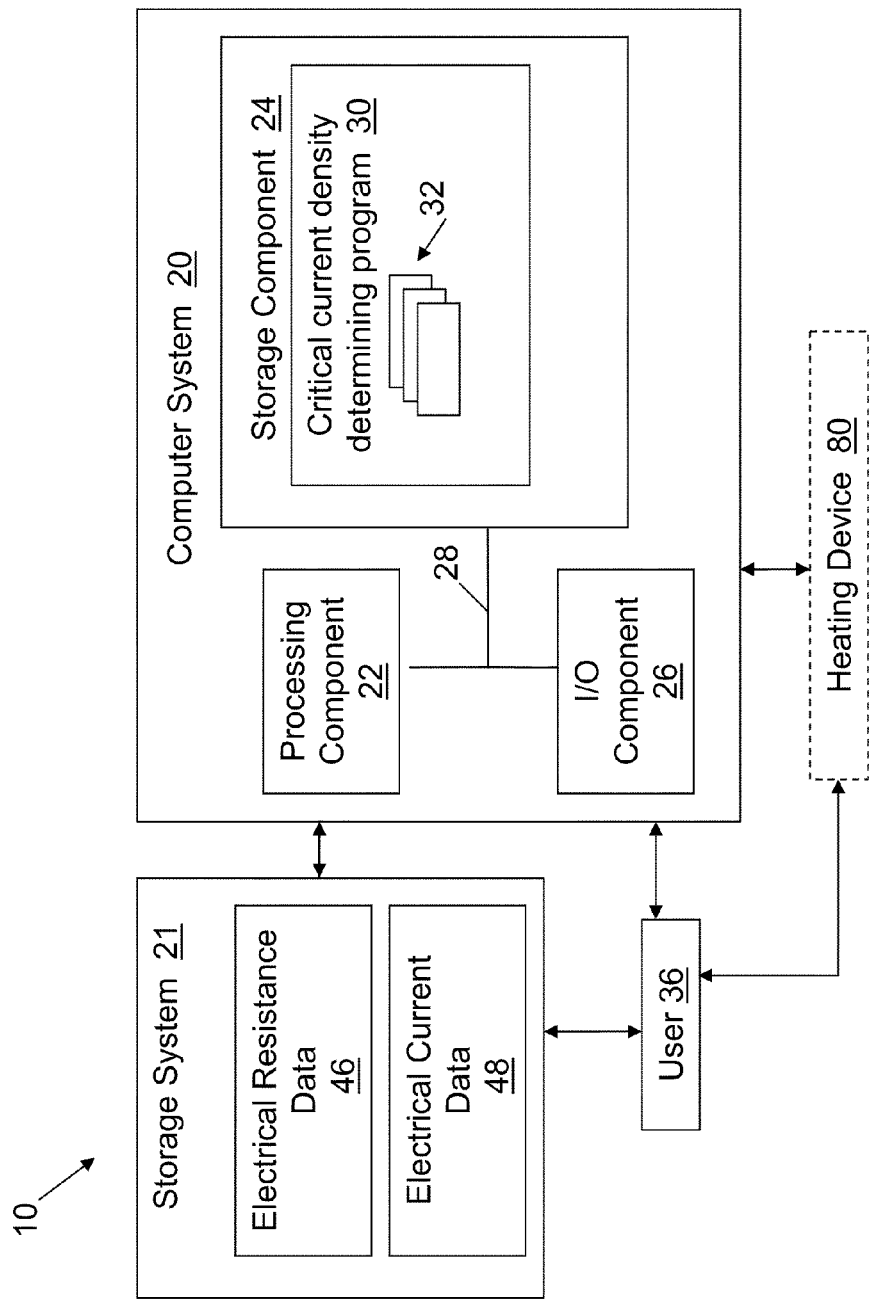
FIG. 2 shows a schematic diagram of an embodiment of a computer system according to one embodiment of the invention.

Turning to FIG. 1, a computer system 20 is shown including a plurality of components. Computer system 20 may include a resistor 40, a calculator 50, an ammeter 60 and a determinator 70. The functions of these components will be further explained with reference to FIGS. 2-4C. In one embodiment, resistor 40, calculator 50, ammeter 60 and determinator 70 may be a plurality of hardware components within computer system 20. However, in another embodiment, these components may be implemented as modules in a critical current density determining program 30 (FIG. 2). In yet another embodiment, these components may be implemented as modules in separate programs, or hardware components in separate physical devices. In any case, these components may be configured to perform the functions described herein.

Turning to FIG. 2, an illustrative environment 10 for determining a critical current density of an interconnect is shown. To this extent, environment 10 includes computer system 20 that can perform a process described herein in order to determine a critical current density of an interconnect. In particular, computer system 20 is shown including critical current density determining program 30, which makes computer system 20 operable to determine a critical current density of an interconnect by performing a process described herein.

Computer system 20 is shown in communication with a storage system 21, which may include electrical resistance data 46 and/or electrical current data 48. Further, computer system 20 is shown in communication with a user 36. A user may, for example, be a programmer or operator. Computer system 20 and user 36 are also shown in connection with a heating device 80 (optionally) for applying a temperature condition to each of a plurality of samples. Interactions between these components and computer system 20 will be discussed in subsequent portions of this application. Computer system 20 is shown including a processing component 22 (e.g., one or more processors), a storage component 24 (e.g., a storage hierarchy), an input/output (I/O) component 26 (e.g., one or more I/O interfaces and/or devices), and a communications pathway 28. In one embodiment, processing component 22 executes program code, such as critical current density determining program 30, which is at least partially embodied in storage component 24. While executing program code, processing component 22 can process data, which can result in reading and/or writing the data to/from storage component 24 and/or I/O component 26 for further processing. Pathway 28 provides a communications link between each of the components in computer system 20. I/O component 26 can comprise one or more human I/O devices or storage devices, which enable user 36 and/or storage system 42 to interact with computer system 20 and/or one or more communications devices to enable user 36 to communicate with computer system 20 using any type of communications link. To this extent, critical current density determining program 30 can manage a set of interfaces (e.g., graphical user interface(s), application program interface, and/or the like) that enable human and/or system interaction with critical current density determining program 30.

In any event, computer system 20 can comprise one or more general purpose computing articles of manufacture (e.g., computing devices) capable of executing program code installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, critical current density determining program 30 can be embodied as any combination of system software and/or application software. In any event, the technical effect of computer system 20 is to provide processing instructions for determining a critical current density of an interconnect.

Further, critical current density determining program 30 can be implemented using a set of modules 32 (e.g., components of FIG. 1). In this case, a module 32 can enable computer system 20 to perform a set of tasks used by critical current density determining program 30, and can be separately developed and/or implemented apart from other portions of critical current density determining program 30. Critical current density determining program 30 may include modules 32 which comprise a specific use machine/hardware and/or software. Regardless, it is understood that two or more modules, and/or systems may share some/all of their respective hardware and/or software. Further, it is understood that some of the functionality discussed herein may not be implemented or additional functionality may be included as part of computer system 20.

When computer system 20 comprises multiple computing devices, each computing device may have only a portion of critical current density determining program 30 embodied thereon (e.g., one or more modules 32). However, it is understood that computer system 20 and critical current density determining program 30 are only representative of various possible equivalent computer systems that may perform a process described herein. To this extent, in other embodiments, the functionality provided by computer system 20 and critical current density determining program 30 can be at least partially implemented by one or more computing devices that include any combination of general and/or specific purpose hardware with or without program code. In each embodiment, the hardware and program code, if included, can be created using standard engineering and programming techniques, respectively.

When computer system 20 includes multiple computing devices, the computing devices can communicate over any type of communications link. Further, while performing a process described herein, computer system 20 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

As discussed herein, critical current density determining program 30 enables computer system 20 to provide processing instructions for determining a critical current density of an interconnect. Critical current density determining program 30 may include logic, which may include the following functions: resistor 40, calculator 50, ammeter 60, and determinator 70. In one embodiment, critical current density determining program 30 may include logic to perform the above-stated functions. Structurally, the logic may take any of a variety of forms such as a field programmable gate array (FPGA), a microprocessor, a digital signal processor, an application-specific integrated circuit (ASIC) or any other specific use machine structure capable of carrying out the functions described herein. Logic may take any of a variety of forms, such as software and/or hardware. However, for illustrative purposes, critical current density determining program 30 and logic included therein will be described herein as a specific use machine. As will be understood from the description, while logic is illustrated as including each of the above-stated functions, not all of the functions are necessary according to the teachings of the invention as recited in the appended claims.

Figure 3:
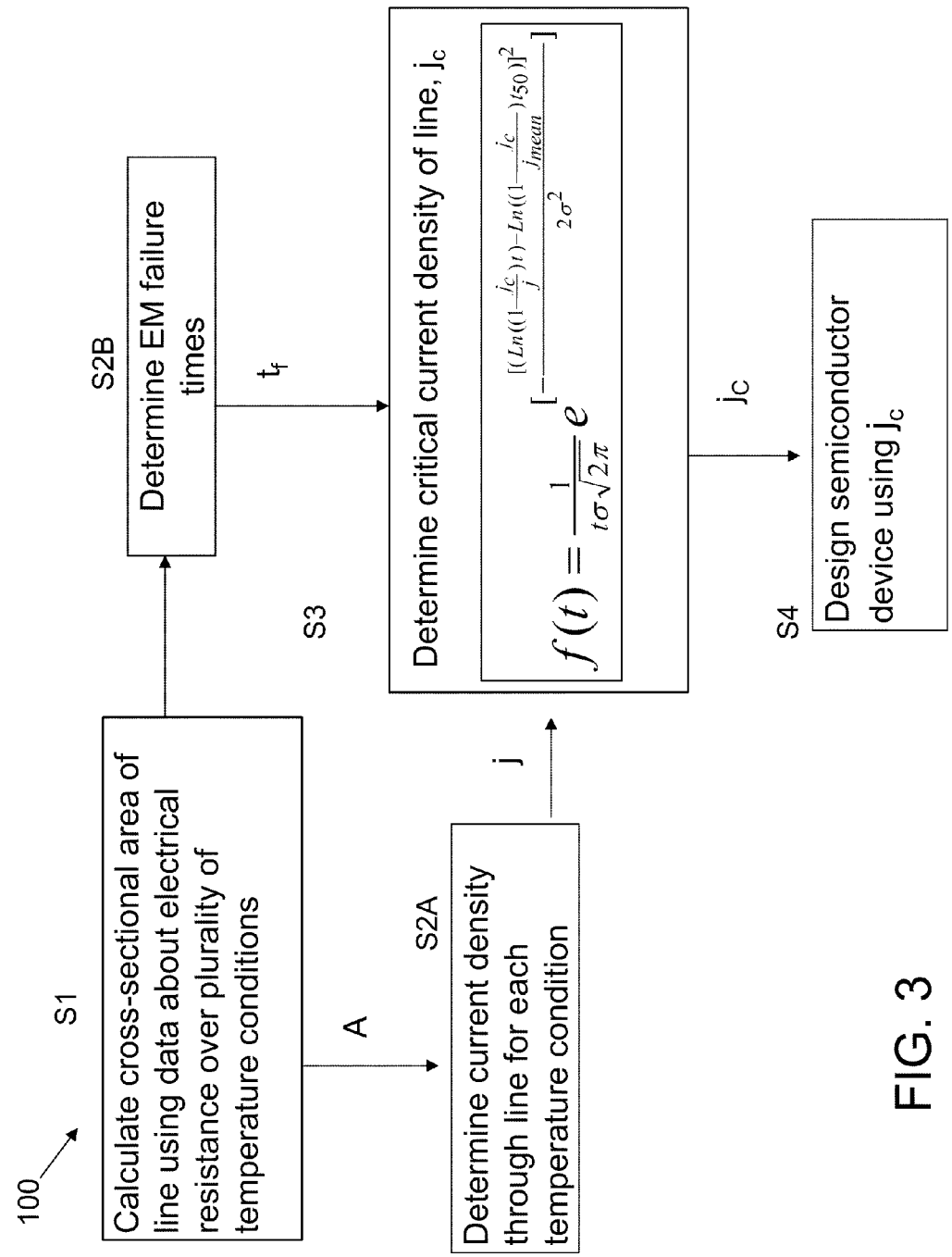
FIG. 3 shows a flow diagram illustrating steps in a method of determining a critical current density for an interconnect according to an embodiment of the invention.

Turning to FIG. 3, a flow diagram 100 illustrating steps in a method of determining a critical current density for an interconnect is shown. In an optional preliminary step (not shown), heating device 80 may apply a temperature condition to a plurality of samples (e.g., wafers). Heating device 80 may be, for example, a conventional oven used for heating semiconductor devices to a desired temperature condition. It is understood that while the following description may at times refer to a single sample (e.g., one wafer), that embodiments of the invention provide for testing of multiple substantially identical samples (e.g., one set of fewer than 20) under different temperature conditions. For example, in one embodiment, twenty or fewer substantially similar samples may be heated and tested (as described herein) at different temperature conditions according to teachings of the invention. This may allow for, among other things, determining a critical current density for an interconnect (e.g., line) common to each sample, while using only a single set of samples.

Turning to step S1, calculator 50 (FIG. 1) calculates a cross-sectional area of a line using a plurality of electrical resistance measurements obtained across a plurality of temperature conditions. In one optional embodiment, electrical resistance measurements may be obtained by resistor 40 (FIG. 1). Resistor 40 may be any device used to measure the electrical resistance of a current-carrying line (e.g., wire). As described herein, resistor 40 may be a computerized component separate from computer system 20, and may be optionally electrically connected to computer system 20 to allow for transmitting of electrical resistance data 46 to computer system 20. In another embodiment, resistor 40 may be electrically separated from computer system 20. In this case, user 36 (FIG. 1) may, for example, input electrical resistance data 46 into computer system 20 via i/o component 26, or input electrical resistance data 46 into storage system 21. In any case, calculator 50 may calculate a cross-sectional area of the line using data about the line's electrical resistance over a plurality of temperature conditions. In one embodiment, the plurality of temperature conditions may be approximately 25 degrees Celsius apart. However, the plurality of temperature conditions may be separated by any number of degrees that allow for an accurate determination of a cross-sectional area of the line.

In step S2A, determinator 70 may determine a current density through the line for each of the plurality samples by dividing an electrical current reading through the line by the cross-sectional area of the line. The electrical current reading may be obtained using ammeter 60, shown optionally in FIG. 1. Ammeter 60 may function as any traditional ammeter, and may measure an electrical current through the line via any conventional means. Ammeter 60, similarly to resistor 40, may be a computerized component separate from computer system 20, and may be optionally electrically connected to computer system 20 to allow for transmitting of electrical current data 48 to computer system 20. In another embodiment, ammeter 60 may be electrically separated from computer system 20. In this case, user 36 (FIG. 1) may, for example, input electrical current data 48 into computer system 20 via i/o component 26, or input electrical current data 48 into storage system 21. In any case, determinator 70 may use electrical current data 48 to determine a current density through the line for each of the plurality of temperature conditions. In one embodiment, determinator 70 may determine the current density through the line for each temperature condition (each different sample) by dividing each electrical current data reading (48) by each calculated cross-sectional area. In this case, determinator 70 may determine a plurality of current densities, corresponding to the plurality of temperature conditions.

In step S2B, determinator 70 may further determine a plurality of electromigration (EM) failure times. As is known in the art of semiconductor design, EM failure times for a line may be determined by monitoring the interconnect resistance and change in current leakage under a) a constant current or b) voltage stress at a predetermined temperature. As is further known in the art, there are two major methods used to determine interconnect EM failure times: module level and wafer level. While both module level and wafer level EM failure time determinations can be made using the teachings described herein, module level determination is discussed for illustrative purposes.

In module-level EM failure determination, semiconductor chips are packaged into modules, and the modules are loaded into heating device 80 (e.g., one or more ovens) or the like for heating to a predetermined temperature condition. In one embodiment of the invention, a set of modules are loaded into ovens separately. However, in another embodiment, the set of modules may be loaded into ovens substantially simultaneously. At that predetermined temperature condition, a constant current (or voltage) is passed through the interconnect, and the resistance variation is monitored over time. Meanwhile, the leakage current between the line under EM stress and its neighboring lines (extrusion monitor lines) may also be monitored. Failure criterion may be pre-set for a given resistance increase and/or a given leakage current level. Once the resistance increase or current leakage reaches its failure criteria level (whichever occurs first), the DUT is considered to fail. The time at which this failure occurs is the failure time. In one embodiment of the invention, failure times are determined for a single set of samples, e.g., one set of substantially identical modules.

In step S3, determinator 70 determines a critical current density of the line using the calculated current density and the plurality of EM failure times. The critical current density for the line may be determined using, for example, a data analysis including a distribution of current densities and the plurality of EM failure times for a single set of data (derived from, e.g., electrical resistance data 46 and electrical current data 48). This single set of data may include, for example, as few as twenty (20) data points, corresponding to the single set of samples (e.g., as few as 20). In one embodiment, using each EM failure time and corresponding current density reading, determinator 70 may derive a plurality of variables to calculate a critical current density ($j_c$) corresponding to that current density reading. For example, determinator 70 may use the following equation to determine a ($j_c$) for each current density reading:

$$f(t) = \frac{1}{t\sigma\sqrt{2\pi}} e^{\left[ -\frac{\left[ (Ln((1-\frac{j_c}{j})t) - Ln((1-\frac{j_c}{j_{mean}})t_{50}) \right]^2}{2\sigma^2} \right]}$$

In the above equation, time-dependent equation t=failure time; σ=standard deviation of failure time (in logarithm) distribution; t50=median of failure time distribution; j=current density; and jmean=mean current density of the data population. It is understood that using the plurality of current density readings (j), a mean current density (jmean) may be derived using known statistical analyses. It is further understood that using the plurality of failure times (t), a standard deviation (σ) and median of failure time distribution (t50) may also be derived using known statistical analyses.

As is known in the art, determination of the critical current density $(j_c)$ may assist in determining a critical product $(jL)_c$, which may involve little more than multiplying the critical current density by the length of the line. Determining the critical product $(jL)_c$ of an interconnect may allow for more effective design of semiconductor structures including the interconnect (step S4).

It is understood that steps S1-S4 may be repeated for each of a plurality of components in a semiconductor device or among a plurality of semiconductor devices. As will be explained with reference to FIGS. 4A-4C, the methods described with reference to FIGS. 1-3 may be applied to a plurality of components in a semiconductor device using the structures described herein.

Figure 4A:
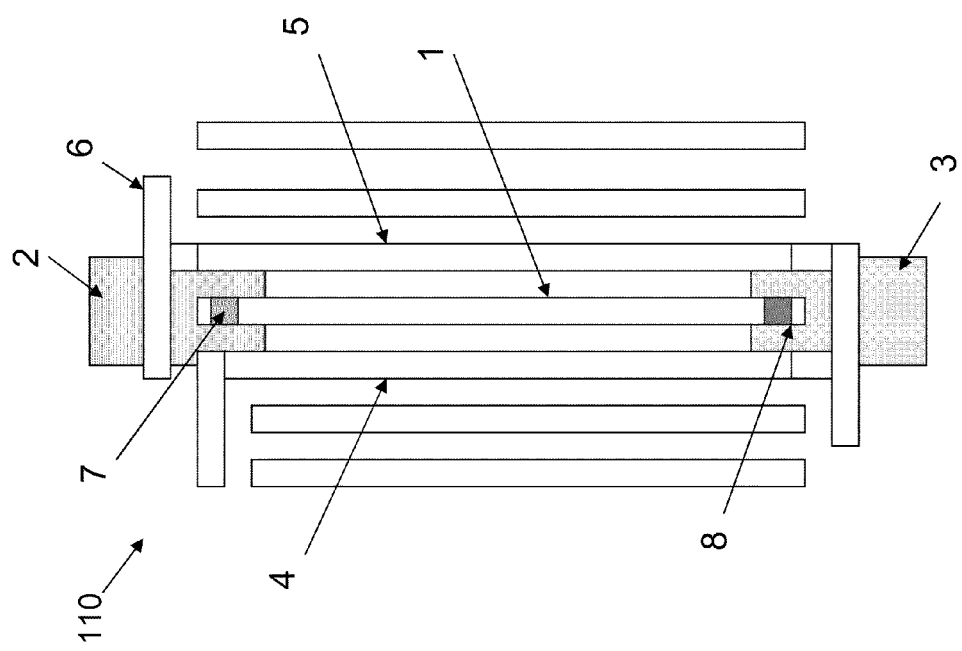
FIGS. 4A-4C show structures for measuring electromigration (EM) stress effect on an integrated circuit according to embodiments of the invention.
Figure 4B:
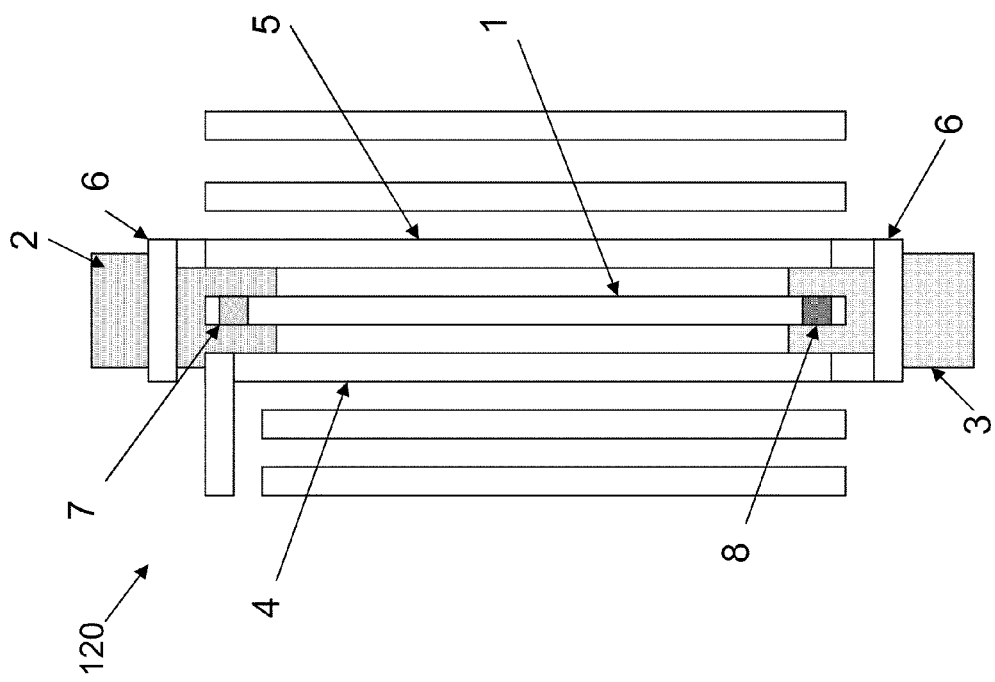
Figure 4C:
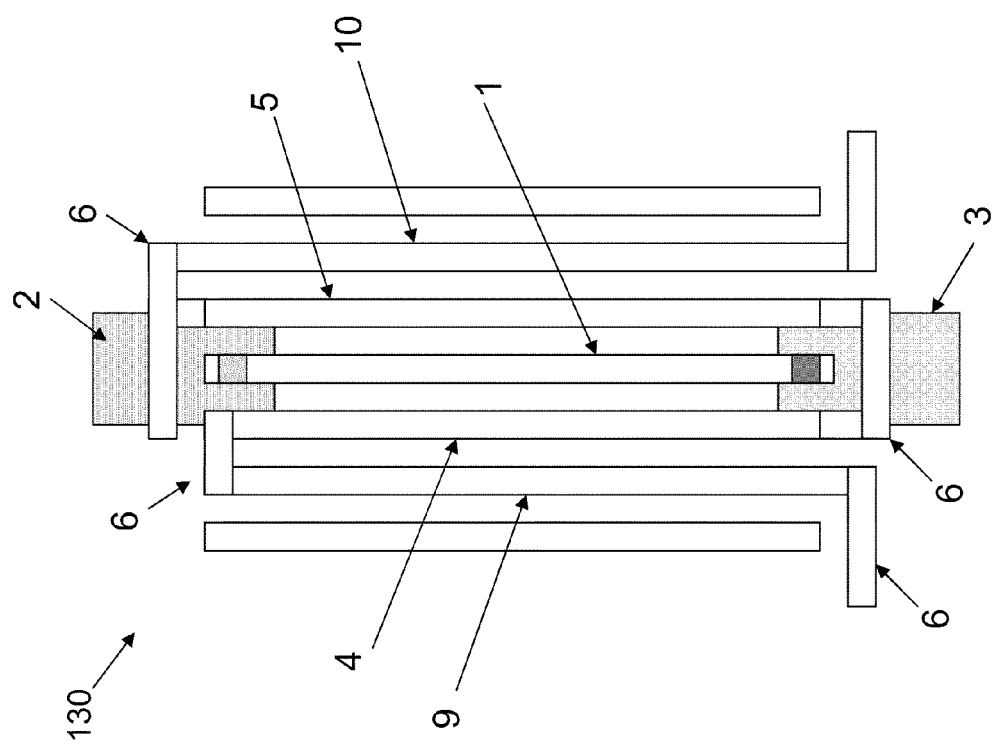

Turning to FIGS. 4A-4C, a plurality of structures 110, 120, 130 are shown for measuring an electromigration (EM) stress effect on an integrated circuit. As shown, in FIG. 4A (starting from the left-hand side), structure 110 may include a fourth line 4 and a fifth line 5, each of which may be connected to the same or distinct power sources (not shown). Also shown is a first line 1, which may be under EM stress, and may be connected to a second line 2 and a third line 3 through at least one via 7, 8, respectively. A sixth line (connecting line) 6 may be configured to monitor an extrusion on first line 1 caused by EM stress on line 1. Where the line is a copper (Cu) line, the extrusion may include a copper (Cu) extrusion. Sixth line 6 may additionally be configured to monitor a resistance of fourth line 4 and fifth line 5 at a plurality of temperature conditions, e.g., temperature conditions described with reference to FIGS. 1-3. Lines 1, 4, 5 and 6 may all be at the same level within a semiconductor device (or module). That is, lines 1, 4, 5 and 6 may all be coplanar. Lines 2 and 3 may be at a different level within the semiconductor device than lines 1, 4, 5 and 6, and may be either on the same level as one another, or on different levels from one another (not coplanar).

In different embodiments, lines 4 and 5 may have two distinct applications: 1) cross-sectional area determination; and 2) extrusion monitoring. When used to determine cross-sectional area, it is understood that lines 4 and 5 may have the same cross-sectional area as line 1. In this case, the cross-sectional area of lines 4 and 5 may be determined by measuring resistances of each of lines 4 and 5 at different temperatures (or together, via a connecting line), and then using the following equation to compute the line's cross-sectional area: $A=[(C)/(dR/dT)]*L$; where A=the cross sectional area of the line; C=a constant attributed to the line type (e.g., Cu, aluminum (Al), Al—Cu, Cu—Al, copper-manganese (Cu—Mn), etc.); dR/dT=differential of the plurality of electrical resistances of the line over the plurality of temperatures; and L=the length of the line. In one embodiment, where the line is a copper line, the equation may read as follows: $A=[(0.006747)/(dR/dT)]*L$. It is also understood that in one embodiment, the cross-sectional area of line 1 may be determined by using the above approach directly on line 1. However, where line 1 is too short to allow for proper Van der Pauw or 4-probe resistance determinations, lines 4 and 5 may be used for this purpose. As is known in the art of electrical engineering, the Van der Pauw and 4-probe resistance determination methods are techniques used for measuring the sheet resistance of a material. As line 1 becomes shorter, via 7, 8 and connecting lines 2 and 3 may further contribute to inaccuracies in resistance readings for line 1. In this case, lines 4 and 5 (which may be longer than line 1 without a via) may be used as, e.g., Van der Pauw structures (meaning accurate Van der Pauw measurements are possible). These structures may alternatively be used for 4-probe resistance measurements in a manner known in the art.

In another embodiment, when used to determine an extrusion failure in line 1, lines 4, 5 and 6 are not connected to line 1 in the case that an extrusion does not exist. An "extrusion", as used in this embodiment, exists when a leakage current between line 1 and one or more of lines 4, 5 and 6 reaches a predetermined level. For example, an extrusion may be determined to exist when a leakage current reaches approximately 1 uA or higher, at a voltage of approximately 1.5 V. It is understood that a variety of leakage currents and corresponding voltages may be used to determine an extrusion, and that the above is merely one example.

A second form of EM stress failure is also measurable using structure 110. In this case, resistance increases in line 1 may be directly measured via conventional techniques (e.g., using resistor 40 and determinator 70) to determine if the increase exceeds a pre-determined level. In this embodiment, the pre-determined resistance increase may be set at, for example, approximately 10%, 20%, 30% etc. In any case, when determinator 70 determines an EM stress failure (either via extrusion or resistance increase), the EM failure time may be recorded and stored in, e.g., storage system 21 or computer system 20.

FIGS. 4B-4C show alternative embodiments to FIG. 4A, and may function substantially similarly to FIG. 4A in measuring the EM stress effect on an integrated circuit. These structures, when used independently or in conjunction with the structure of FIG. 4A, may increase the accuracy of resistance measurements. Turning to FIG. 4B, a structure 120 is shown including substantially similar elements as FIG. 4A, however, in FIG. 4B, line 4 and line 5 may be connected as a single line using connecting line 6. Where line 4 and line 5 are connected (through line 6) as a single line, the Van der Pauw method may be more accurate in determining the resistance of that composite line. Turning to FIG. 4C, a structure 130, similar to structure 120 of FIG. 4B is shown, but in this case, additional connecting lines 6 may be used to further lengthen lines 4 and 5. In this case, connecting lines 6 form connections between lines 4, 5, 9 and 10, further increasing the accuracy of the Van der Pauw resistance determination. This structure may be used, for example, when determining the resistance of line 1 when its length is even smaller than in the embodiments of FIGS. 4A & 4B.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method of determining a critical current density in a line, the method comprising:
    applying a temperature condition to each of a plurality of samples including the line;
    calculating a cross-sectional area of the line for each of the plurality samples using data about an electrical resistance of the line over each of the temperature conditions;
    measuring an electrical current reading through the line for each of the plurality of samples;
    determining a current density through the line for each of the plurality of samples by dividing each electrical current reading by each corresponding cross-sectional area;
    determining an electromigration (EM) failure time for each of the plurality of samples; and
    determining the critical current density of the line using the current density and the plurality of EM failure times.

2. The method of claim 1, wherein each of the temperature conditions are unique and are separated from one another by constant temperature intervals.

3. The method of claim 1, wherein the line includes at least one of: copper (Cu), aluminum (Al), Al—Cu, Cu—Al, and copper-manganese (Cu—Mn).

4. The method of claim 3, wherein the line is under EM stress.

5. The method of claim 1, wherein the line is under EM stress, and further comprising:
    repeating the applying of the temperature conditions, the determining of the cross-sectional area, the measuring of the electrical current, the determining of the current density, the determining of the plurality of EM failure times, and the determining of the critical current density for at least one of: an extrusion monitor line and a resistance measurement line.

6. The method of claim 5, wherein the resistance measurement line is electrically connected to a plurality of connecting lines, and further comprising:
    repeating the applying of the temperature conditions, the determining of the cross-sectional area, the measuring of the electrical current, the determining of the current density, the determining of the plurality of EM failure times, and the determining of the critical current density for the line.

7. The method of claim 1, wherein the temperature conditions consist of at least 3 unique temperature conditions.

8. A structure for measuring electromigration (EM) stress effect on an integrated circuit, the structure comprising:
    a first line configured to experience the EM stress, the first line connected to a second line and a third line through at least one via;
    a fourth line and a fifth line adjacent to and coplanar with the first line; and
    a sixth line configured to monitor an extrusion of the first line and a resistance of the fourth and the fifth lines at a plurality of temperature conditions, wherein each of the second line and the third line are on a different plane than the first line, and wherein the second line and the third line are configured to: provide a stress current to the first line and measure a resistance of the first line while the first line is under the EM stress.

9. The structure of claim 8, wherein the first line under EM stress contacts one of the fourth line, the fifth line, and the sixth line due to an extrusion.

10. The structure of claim 8, wherein the fourth line has a width equal to a width of the first line.

11. The structure of claim 8, wherein the fourth line and the fifth line are connected through at least one connecting line.

12. The structure of claim 8, wherein the second line is coplanar with the third line.

13. A system for determining a critical current density in a line, the system comprising:
    a resistor for measuring an electrical resistance of the line in each of a plurality of samples including the line, wherein each of the plurality of samples is measured at a temperature condition;
    a calculator for calculating a cross-sectional area of the line for each of the plurality of samples using the plurality of electrical resistances of the line over each of the temperature conditions;
    an ammeter for measuring an electrical current reading through the line for each of the plurality of samples; and
    a determinator for:
        determining a current density through the line for each of the plurality of samples by dividing each electrical current reading by each corresponding cross-sectional area;
        determining an electromigration (EM) failure time for each of the plurality of samples; and
        determining the critical current density of the line using the current density and the plurality of EM failure times.

14. The system of claim 13, wherein each of the temperature conditions are unique and are separated from one another by constant temperature intervals.

15. The system of claim 13, wherein the line includes at least one of: copper (Cu), aluminum (Al), Al—Cu, Cu—Al, and copper-manganese (Cu—Mn).

16. The system of claim 15, wherein the line is under EM stress.

17. The system of claim 16, wherein the resistor, calculator, ammeter and determinator further:
    repeat the applying of the temperature conditions, the determining of the cross-sectional area, the measuring of the electrical current, the determining of the current density, the determining of the plurality of EM failure times, and the determining of the critical current density for at least one of: an extrusion monitor line and a resistance measurement line.

18. The system of claim 17, wherein the resistance measurement line is electrically connected to a plurality connecting lines, wherein the resistor, calculator, ammeter and determinator further:
    repeat the applying of the temperature conditions, the determining of the cross-sectional area, the measuring of the electrical current, the determining of the current density, the determining of the plurality of EM failure times, and the determining of the critical current density for the line.

19. The system of claim 13, wherein the temperature conditions correspond to at least 3 unique temperature conditions.

20. The system of claim 13, wherein the line is a copper line, and the cross-sectional area of the line is calculated using the following equation:

$$A=[(0.006747)/(dR/dT)]*L;$$

where A=the cross sectional area of the line; dR/dT=differential of the plurality of electrical resistances of the line over the plurality of temperature conditions; and L=a length of the line.

* * * * *